(12) United States Patent
Petilli

(10) Patent No.: US 9,917,593 B2
(45) Date of Patent: Mar. 13, 2018

(54) LOGARITHMIC ANALOG TO DIGITAL CONVERTER DEVICES AND METHODS THEREOF

(71) Applicant: Intrinsix Corp., Marlborough, MA (US)

(72) Inventor: Eugene M. Petilli, Victor, NY (US)

(73) Assignee: Intrinsix Corp., Marlborough, MA (US)

( * ) Notice: Subject to any disclaimer, the term of this patent is extended or adjusted under 35 U.S.C. 154(b) by 0 days.

(21) Appl. No.: 15/381,863

(22) Filed: Dec. 16, 2016

(65) Prior Publication Data

US 2017/0179972 A1 Jun. 22, 2017

Related U.S. Application Data

(60) Provisional application No. 62/268,319, filed on Dec. 16, 2015.

(51) Int. Cl.
*H03M 1/12* (2006.01)
*H03M 3/00* (2006.01)

(52) U.S. Cl.
CPC ......... *H03M 1/1245* (2013.01); *H03M 3/424* (2013.01)

(58) Field of Classification Search
CPC .......................... H03M 1/1245; H03M 3/424
USPC .................................................. 341/155, 118
See application file for complete search history.

(56) References Cited

U.S. PATENT DOCUMENTS

| | | | | |
|---|---|---|---|---|
| 4,113,997 A | * | 9/1978 | Horna ....................... | H04B 3/23 324/132 |
| 6,633,247 B2 | * | 10/2003 | Yakabe .................. | H03M 1/664 327/350 |
| 7,623,053 B2 | * | 11/2009 | Terry .................... | A61N 1/3704 341/143 |
| 9,066,022 B2 | * | 6/2015 | Tuttle ................. | H04N 5/23229 |

\* cited by examiner

*Primary Examiner* — Brian Young
(74) *Attorney, Agent, or Firm* — LeClairRyan, a Professional Corporation

(57) ABSTRACT

An analog to digital converter includes an error integration circuit configured to receive an input charge from a detector and to integrate a difference between the input charge and one or more feedback charge pulses to create an error voltage. A quantizer is in operable communication with the error integration circuit and is responsive to the created error voltage. An accumulator having a mantissa component and a radix component is in operable communication with the quantizer. A charge feedback device in operable communication with the quantizer and the radix component of the accumulator. The charge feedback device is configured to generate the one or more feedback charge pulses proportional to the radix component of the accumulator and an output of the quantizer. Digital focal plane read out integrated circuits including the analog to digital converter are also disclosed.

24 Claims, 13 Drawing Sheets

Integration time 160us-5ms
Frame rate 30Hz - 1500Hz
(33ms - 650us)

charge on e- = 1.60217657e-19
6.241e18 e-/sec = 1A
60nA*40us = 15e6 e-
noise=1500e- (80dB = 13.3bits)

40us* 8nA / C =1V
C = 320fF

Sample Times for 'logsdm2'

| Color | Annotation | Description | Value |
|---|---|---|---|
| ■ | Cont | Continuous | 0 |
| ▨ | D1 | Discrete 1 | 1.14489e-09 |
| ▨ | D2 | Discrete 2 | 1.9531e-08 |
| ■ | D3 | Discrete 3 | 4e-05 |
| ▨ | D4 | Discrete 4 | 0.00016 |
| ▨ | Inf | Constant | Inf |
| ▨ | H | Hybrid | Not Applicable |

*FIG. 9*

LOGARITHMIC ANALOG TO DIGITAL CONVERTER DEVICES AND METHODS THEREOF

This application claims the benefit of U.S. Provisional Patent Application Ser. No. 62/268,319, filed Dec. 16, 2015, which is hereby incorporated by reference in its entirety.

FIELD

This technology generally relates to a logarithmic based analog to digital converter and methods of use thereof. More specifically, the technology relates to piecewise linear logarithmic analog digital converters that may be utilized to form read-out integrated circuits for extended dynamic range digital focal plane arrays.

BACKGROUND

Focal plane arrays include a detector array and corresponding read-out integrated circuit. In the early days of imaging, the detector array and read-out integrated circuit were implemented on one monolithic integrated circuit and the active area was dominated by the detector photo diode array. With modern three-dimensional hybridization processes, such as bump bonding and copper pillars, the detector array can be implemented in a specialized process technology and the read-out integrated circuit can be implemented in a high-density commercial process. This enables the large area under the detector array to be used for higher integration readout circuitry, including an analog to digital converter per pixel.

One compatible detector array utilizes micro-bolometers as a variable resistor responsive to infrared. Another detector array technology is a strained-layer super lattice as a charge output photodiode where structures are formed by selective deposition of thin layers of different semiconductor materials one above the other in a stacked arrangement to create a plurality of heterojunctions in the vertical or stacking direction. Many current strained-layer super lattice sensors have a size of 256×256 or 256×320 pixels. It is expected that in the near term the size will increase to 512×512 pixels as the strained-layer super lattice fabrication process improves. Long term expectations are for 1920×1080 pixel imagers. As the technology scales up to 1920×1080 imagers with read-outs of 120 frames per second, read-out solutions must be improved.

Two-dimensional arrays of per pixel analog to digital converters have been utilized. Very high dynamic range systems present several challenges to such systems. A dominant portion of the analog to digital converter area is consumed by the counter, which increases in size linearly with the dynamic range (number of bits). These fully independent analog to digital converters do not have a global input to enable "skimming" to remove a portion of the scene offset charge before the analog to digital converter, therefore requiring more bits. The single capacitor (and its single reset) is sized for the smallest least significant bit (LSB), which necessitates an integration time proportional to the larger dynamic range instead of an integration time proportional to the object of interest signal to noise ratio (SNR) required for object identification. These difficulties result in larger area, higher power consumption and slower frame rates.

SUMMARY

An analog to digital converter includes an error integration circuit configured to receive an input charge from a detector and to integrate a difference between the input charge and one or more feedback charge pulses to create an error voltage. A quantizer is in operable communication with the error integration circuit and is responsive to the created error voltage. An accumulator having a mantissa component and a radix component is in operable communication with the quantizer. A charge feedback device in operable communication with the quantizer and the radix component of the accumulator. The charge feedback device is configured to generate the one or more feedback charge pulses proportional to the radix component of the accumulator and an output of the quantizer.

A digital focal plane read out integrated circuit includes a detector and an analog to digital converter coupled to the detector. The analog to digital converter includes an error integration circuit configured to receive an input charge from the detector and to integrate a difference between the input charge and one or more feedback charge pulses to create an error voltage. A quantizer is in operable communication with the error integration circuit and is responsive to the created error voltage. An accumulator having a mantissa component and a radix component is in operable communication with the quantizer. A charge feedback device is in operable communication with the quantizer and the radix component of the accumulator. The charge feedback device is configured to generate the one or more feedback charge pulses proportional to the radix component of the accumulator and an output of the quantizer.

A digital focal plane read out integrated circuit includes a plurality of detectors formed in an array and an analog to digital converter coupled to each of the plurality of detectors in the array. Each of the analog to digital converters includes a error integration circuit configured to receive an input charge from the detector and to integrate a difference between the input charge and one or more feedback charge pulses to create an error voltage. A quantizer is in operable communication with the error integration circuit and is responsive to the created error voltage. An accumulator having a mantissa component and a radix component is in operable communication with the quantizer. A charge feedback device is in operable communication with the quantizer and the radix component of the accumulator. The charge feedback device is configured to generate the one or more feedback charge pulses proportional to the radix component of the accumulator and an output of the quantizer.

Examples of the present technology advantageously provide a logarithmic analog to digital converter (LADC) 10 that may be utilized in imaging applications. The LADC 10 may be applied in read-out integrated circuits for extended dynamic range imaging applications. By way of example only, the exemplary LADC 10 may be utilized for read-out integrated circuits configured as part of digital imaging applications such as a focal plane imager array, a back side illuminated CMOS, a quantum well infrared photodetector, a corrugated quantum well infrared photodetector, a strained layer superlattice sensor, an InGaAs photodiode, an n-type/Barrier/n-type detector, or Hg1-xCdxTe detectors, although the LADC 10 may be utilized for other detectors or types of diode arrays. The exemplary technology provides a number of advantages including providing higher dynamic range and lower power consumption while maintaining a constant signal to noise and distortion ratio over multiple octaves of input signal. By digitizing using a logarithmic response, the detector can digitize a larger dynamic range while consum-

BRIEF DESCRIPTION OF THE DRAWINGS

FIG. 9 is a schematic block diagram of exemplary sample times used in an example of a analog to digital converter of the present technology.

DETAILED DESCRIPTION

Figure 1:
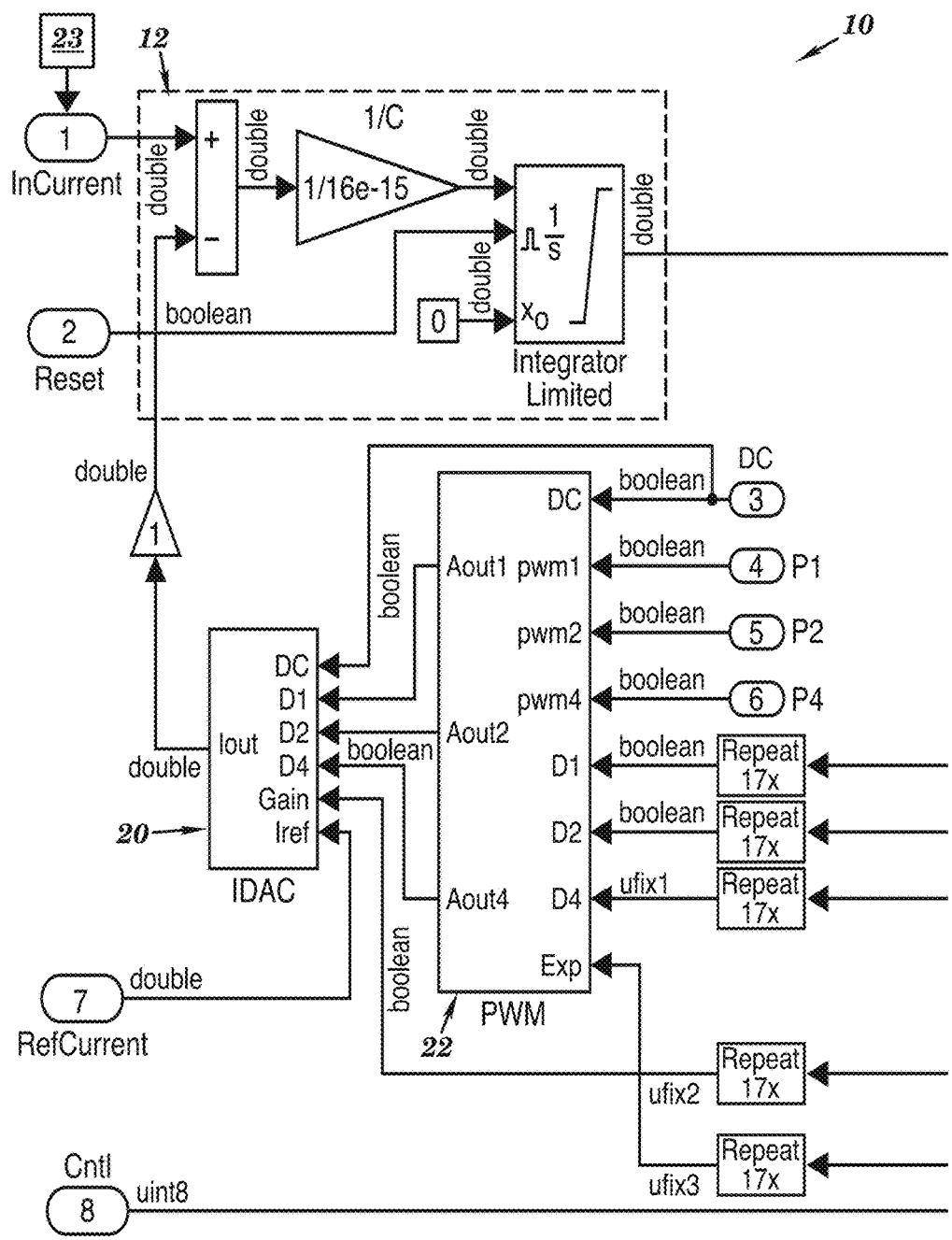
FIG. 1 is a schematic block diagram of an exemplary closed loop log 2 output analog to digital converter.
Figure 1:
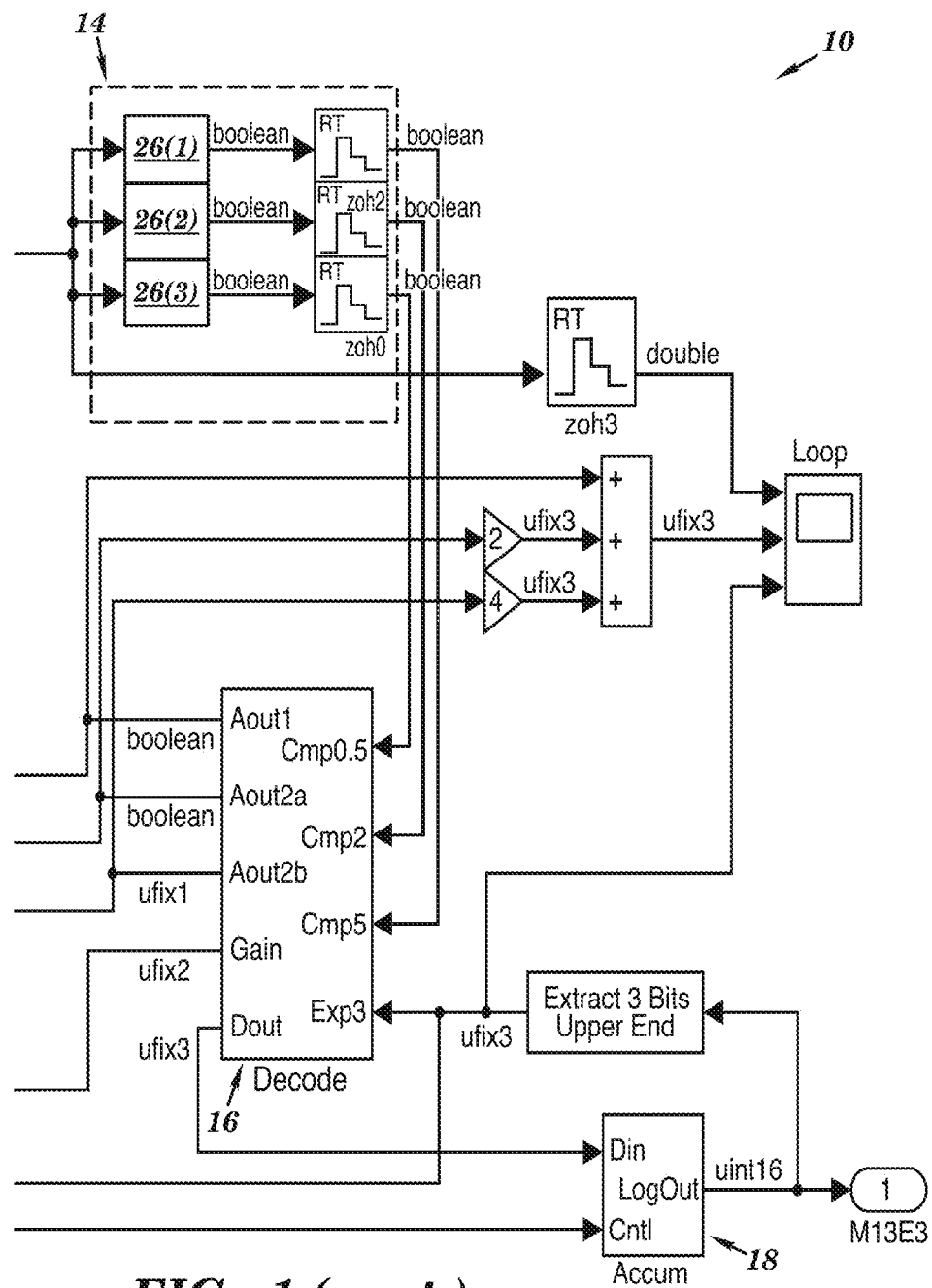
Figure 2:
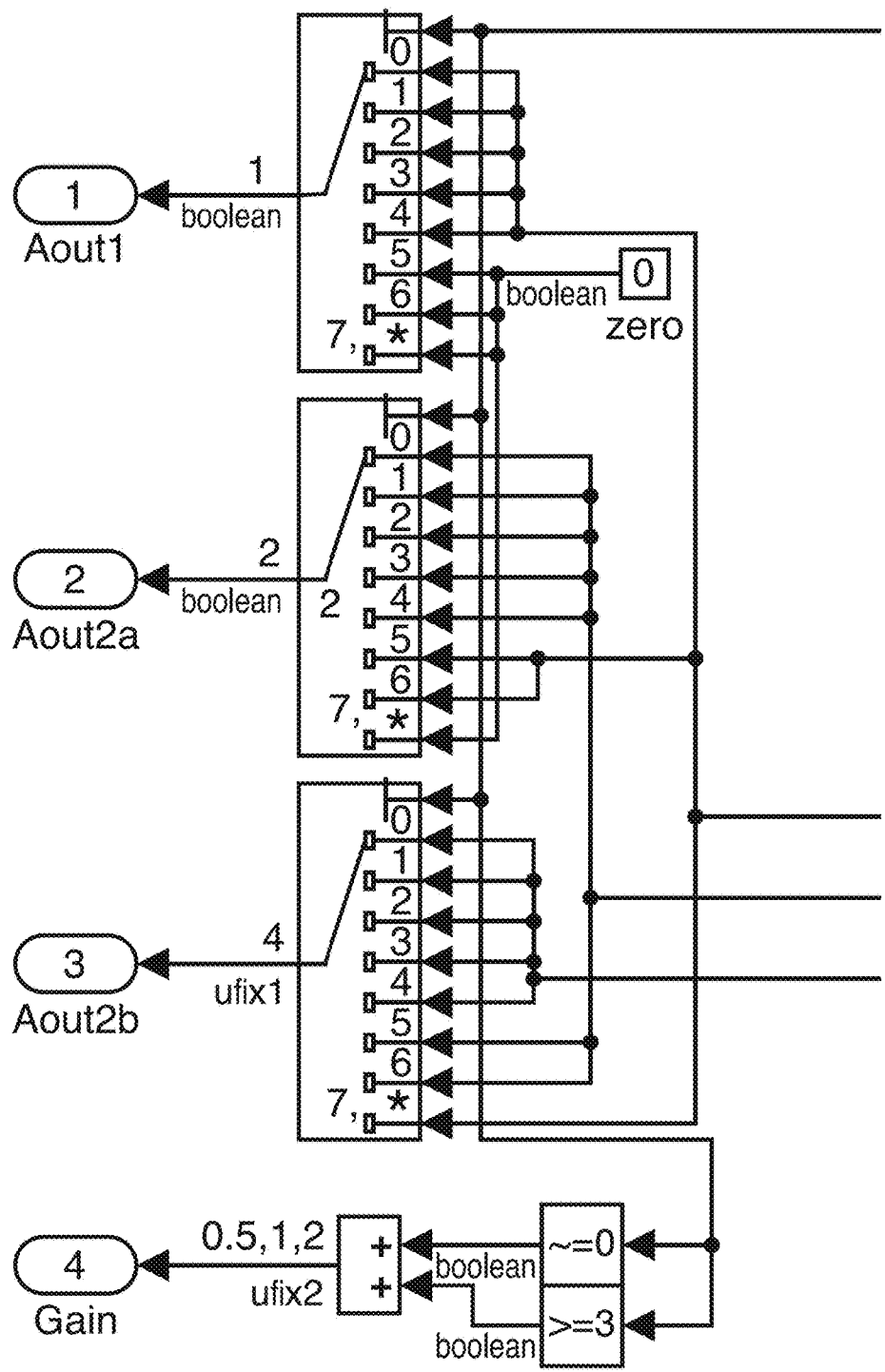
FIG. 2 is a schematic block diagram of an exemplary decoder block which is responsive to the current radix and quantizer and generates multi-bit digital feed-forward and feed-back signals as illustrated in FIG. 1.
Figure 2:
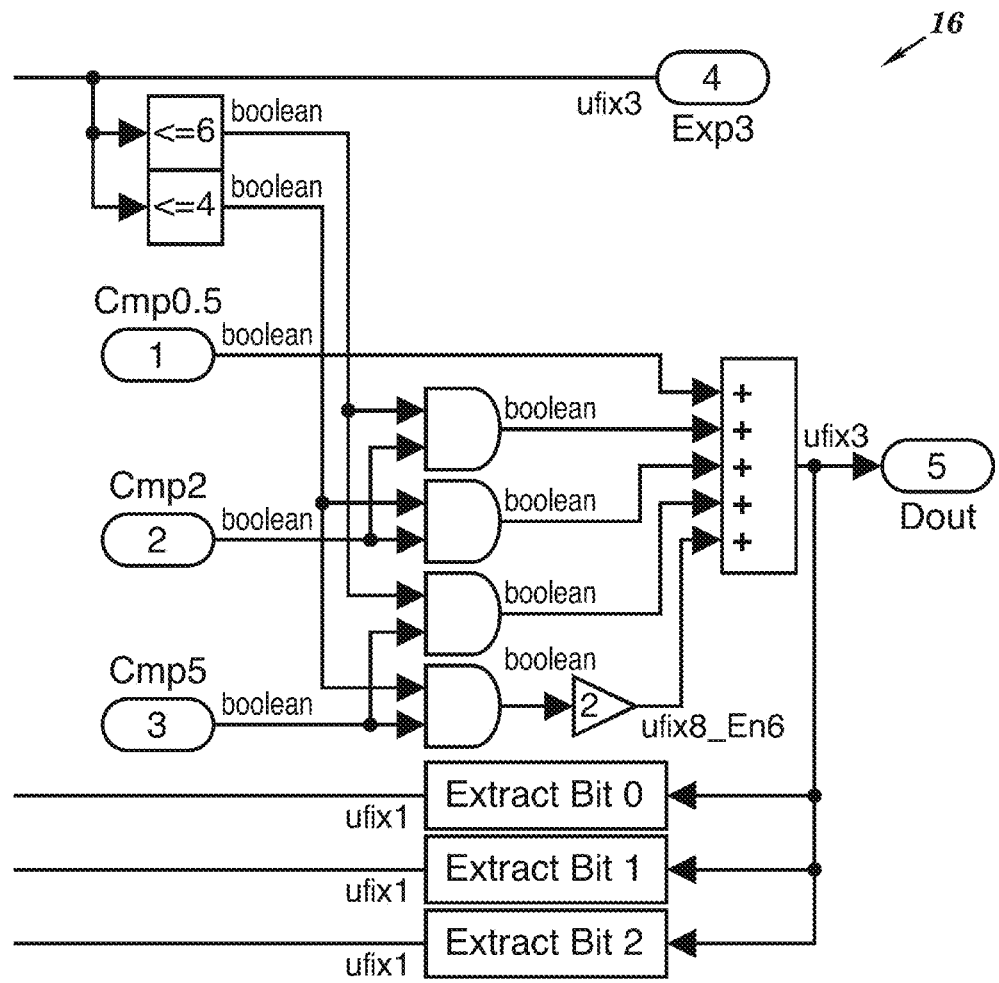

An example of a logarithmic analog to digital converter (LADC) 10 that may be utilized in imaging applications is illustrated in FIGS. 1-5. In this particular example, the LADC 10 includes an error integration circuit 12, an error detection voltage circuit 13, a multibit quantizer 14, a decoder block 16, accumulators 18, a current output digital to analog converters (IDAC) 20 and a pulse with modulator (PWM) 22, although the LADC 10 may include other types and/or numbers of other systems, devices, components, and/or other elements in other configurations, such as additional multibit quantizers, accumulators, or charge feedback devices, by way of example only.

The exemplary LADC 10 may be applied in read-out integrated circuits for extended dynamic range imaging applications. By way of example only, the exemplary LADC 10 may be utilized for read-out integrated circuits configured as part of digital imaging applications, such as a focal plane imager array, a back side illuminated CMOS, a quantum well infrared photodetector, a corrugated quantum well infrared photodetector, a strained layer superlattice sensor, an InGaAs photodiode, an n-type/Barrier/n-type detector, or Hg1-xCdxTe detectors, although the LADC 10 may be utilized for other detectors or types of diode arrays.

The exemplary technology provides a number of advantages including providing higher dynamic range and lower power consumption while maintaining a constant signal to noise and distortion ratio over multiple octaves of input signal. By digitizing using a logarithmic response, a detector utilized with the LADC can digitize a larger dynamic range while consuming less power and circuit area without any perceptible loss of signal to noise distortion ratio.

In this example, the error integration circuit 12 of the LADC 10 includes an integrator or capacitor by way of example. The error integration circuit 12 is coupled to a diode array or detector 23 to receive an input signal current. By way of example, the detector may be a focal plane imager array, a back side illuminated CMOS, a quantum well infrared photodetector, a corrugated quantum well infrared photodetector, a strained layer superlattice sensor, an InGaAs photodiode, an n-type/Barrier/n-type detector, or Hg1-xCdxTe detectors, although the error integration circuit 12 of the LADC 10 may be coupled to other types of detectors for other imaging applications, such as diode arrays.

The error integration circuit 12 is configured to receive and integrate the input signal current via direct injection to an error summing (integration) node 24 of the error integration circuit 12. In this example, the error integration circuit 12 is further configured to receive and integrate a multi-level feedback charge from the IDAC 20 coupled to the PWM 22. In other examples, the error integration circuit 12 may receive and integrate the multi-level feedback charge from the IDAC 20 only without the use of PWM 22. Alternatively, the error integration circuit may receive and integrate the multi-level feedback charge from the PWM 22 only without the IDAC 20, although other configurations using other feedback devices are contemplated. In this example, the error integration circuit 12 is large relative to the sample rate of the IDAC 20 or the PWM 22 in order to reduce the noise bandwidth of the system error integration. The error integration circuit 12 integrates, using the error summing node 24, a difference between the input charge and feedback charge pulses from the charge feedback devices, IDCA 20 and PWM 22, to create an error voltage. The error integration circuit 12 is operably coupled to the multibit quantizer 14 to output the created error voltage to multibit quantizer 14, by way of example.

The multibit quantizer 14 is operably coupled to the error integration circuit 12 to receive the created error voltage as an input. In this example, the multibit quantizer 14 comprises a plurality of digital inverters or comparators 26(1)-26(n) with different input thresholds as determined by the relative sizes of the pull-up and pull-down devices of the comparators 26(1)-26(n), although other comparators, such as analog inverters by way of example only, may also be utilized. In this example, the output from the error integration circuit 12 is distributed among the comparators 26(1)-26(n).

The multibit quantizer 14 is responsive to the input error voltage from the error integration circuit 12. The multibit quantizer 14 may utilize a different number of comparators 26(1)-26(n) depending on the application to which the input error voltage is distributed. In one example, since the LADC 10 can represent an extended dynamic range, at least two comparators are utilized so that during any single evaluation cycle, at least two octaves of signal can be represented. In another example, up to eight comparators may be utilized to represent up to eight octaves of signal. In yet another example, three comparators are used to generate digital "thermometer" outputs of 0, 1, 3, 6 (delta step sizes of 1, 2, 3) thresholds of 0.5, 2.0, 4.5, by way of example only, although other thresholds, such as thresholds that are log 2 spaced instead of the midpoint of the digital outputs may be utilized. The multibit quantizer 14 is operably coupled to the decoder block 16 to provide the output from comparators 26(1)-26(n) to the decoder block 16.

The decoder block 16 receives the output from the multibit quantizer 14, in this example the comparators 26(1)-26(n), and distributes the outputs to the accumulator 18 and the charge feedback devices, IDAC 20 and PWM 22, although the decoder block 16 may distribute the outputs from the multibit quantizer 14 to other devices or components, such as additional types and numbers of accumulators or charge feedback devices, by way of example only. The decoder block 16 is illustrated in further detail in FIG. 2. The decoder block 16 is responsive to the multibit quantizer 14 and generates multi-bit digital feed-forward and feed-back signals that are output to the accumulator 18.

In this example, the accumulator 18 is implemented as a plurality of adders with some number of most significant digits pre-defined to represent the active radix component of the LADC 10 and the remaining bits defined to be the mantissa component of the sum, although a plurality of accumulators may be utilized. An exemplary accumulator 18 is illustrated in further detail in FIG. 3. In one example, the running sum is encoded using a 16 bit floating point number with 13 bit mantissa component and 3 bit radix component, although other running sums may be utilized. The radix component of the active sample is $2^r$ so a 3 bit radix component equates to a range of 256:1. This floating point number spans a dynamic range of $(1*2^0)$ to $(8191*2^8)$ or 2071296:1 (126.3 dB).

Figure 4:
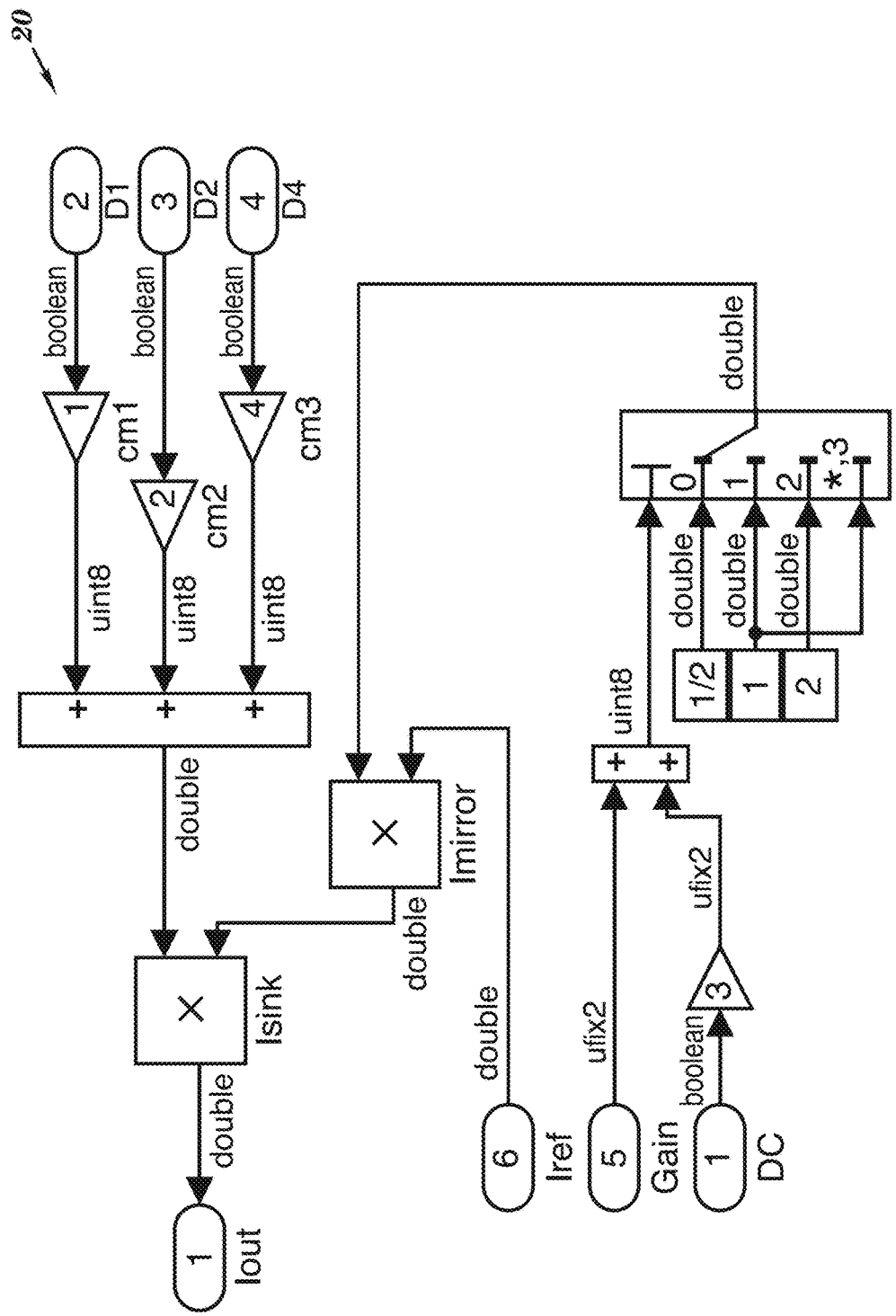
FIG. 4 is a schematic block diagram of an exemplary current output digital to analog converter.

In this example, the LDAC 10 includes charge feedback device IDAC 20, although other types and numbers of charge feedback devices may be utilized, such as PWM device 22. In this example, IDAC and PWM work in combination to provide a feedback charge to the error integration circuit 12. Referring to FIG. 4, a block diagram of one example of IDAC 20 where the binary weighted "slave" enables are given by D1, D2, D3 (responsive to the quantizer outputs) and the global current bias "Iref" is multiplied by the "Gain" to create the unit current used by the slave outputs. In at least one example, the IDEC 20 is implemented as a standard two stage current manifold, with an input reference current, a ratio-metric mirror, and a plurality of binary weighted slave mirrors. During a DC or scene temperature "skimming" period, the "Gain" is forced to be a constant value, independent of the radix component.

In another example, the IDAC 20 is implemented as a linear multi-bit current output digital to analog converter where the number of input bits is at least 2^max_radix. In another example, the IDAC 20 is formed using a multi-bit log 2 current output digital to analog converter, where the number of bits is at least the max_radix. In yet another embodiment, the IDAC 20 is implemented as a sigma-delta modulator based current output digital to analog converter.

Figure 5:
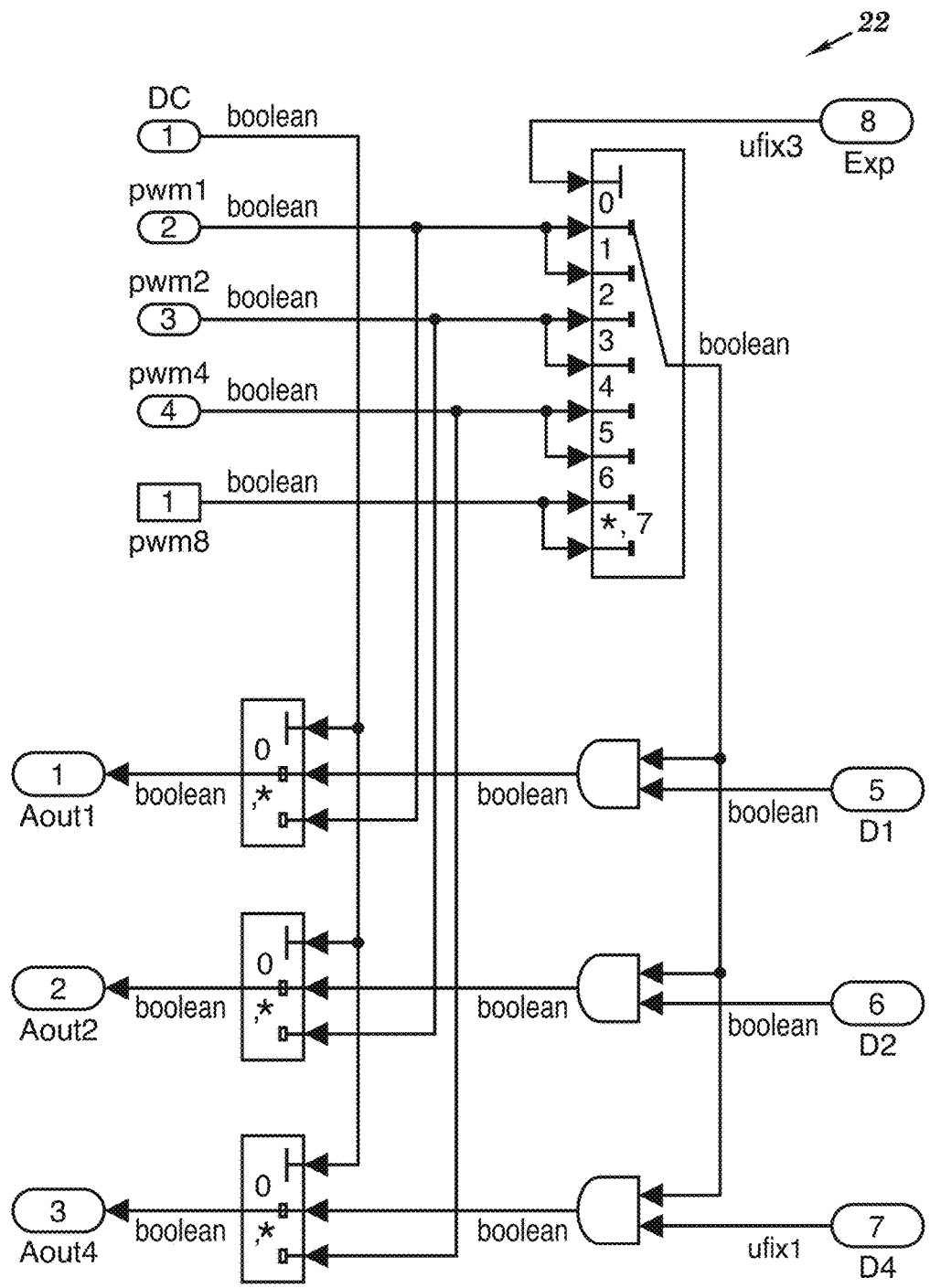
FIG. 5 is a schematic block diagram of an exemplary pulse width modulator responsive to global pulse width modulation ramp signals, the current radix and quantizer.

In this example, PWM 22 is coupled to IDAC 20 to control the multi-bit current output IDAC 20. Referring to FIG. 5, a circuit diagram of one example of PWM 22, which based on the active radix (Exp3) selects between a plurality of pulse width modulation inputs, each with a different duty cycle, to create an active pulse width modulation control, is illustrated. The active PWM 22 is logically combined with the IDAC 20 to enable creation of a current with an amplitude based on the IDAC 20 controls and a pulse width based on the active PWM 22 such that the fed-back charge for the active quantizer cycle is predominately proportional to the digital value added by the accumulator 18. In this example, the LADC provides an input time bases circuit configured to control timing of the charge to error voltage conversion to create the error voltage. The input time bases circuit provides a plurality of pulse-width modulated signals having a range of widths that at least partially cover a radix range of the accumulator 18.

During the DC scene "skimming" portion of the quantizer cycle, the multibit quantizer 14 output is ignored and the IDAC 20 is instead controlled by the global pulse width modulation control signals from the PWM 22 directly. In one example, during the DC period, the magnitude of the scene is presented on the control signals of the PWM 22 globally to multiple LADCs 10. In another example, multiple digital to analog conversion technologies may be utilized together to reduce the dynamic range requirements of each digital to analog converter and save circuit area.

In one example, a plurality of LADCs, such as LADC 10 as illustrated schematically in FIG. 1, are arrayed into a two-dimensional LADC array arranged with a pitch compatible with a photon detector array to form a read-out integrated circuit, although the LADC 10 may be utilized with other types of detectors or diode arrays. The read-out integrated circuit comprising the array of LADCs is "hybridized" to the detector array using 3D chip scale interconnect technology such as bump bonding or copper pillar bonding, although other methods may be utilized. In another example, micro-bolometers can be patterned directly on top of the read-out integrated circuit using micro electrical mechanical system (MEMS) fabrication technology. These three-dimensional technologies create a digital focal plane array with a LADC per pixel. This configuration allows for the use of global resources for multi-level feedback and scene skimming.

An exemplary operation of a LADC 10 will now be described with reference to FIGS. 1-5. The input signal current from the detector 23 is direct injected into the error-summing node 24 of the error integration circuit 12 along with a multi-level feedback charge from the charge feedback devices IDAC 20 and PWM 22. A difference between the input signal current and the multi-level feedback charge is integrated by the error integration circuit 12 to convert the error charge into an error voltage. The error summing node 24 may also include variable gain by altering the effective size of the error integration circuit 12.

Unlike other direct injection architectures which reset the integrating error integration circuit 12 to a constant voltage, the feedback charge amplitude for the present technology is responsive in part to the most significant digits of the digital register of the accumulator 18. Traditional resetting has a disadvantage that during the resetting, integration cannot be performed because during the resetting time period the integrating device is reset to a constant voltage and, therefore, is unresponsive to the input signal.

By feeding back during the reset period, continuous input signal integration can be achieved and the analog to digital conversion accuracy is improved. This implies that a time-base is used to control the charge fed back since current by definition is charge transitioning per unit time. The resulting error voltage is more of a triangle wave than the sawtooth wave resulting from resetting. While the negative feedback charge is being integrated onto the error integration circuit 12, the positive input charge is also integrating, and the voltage across the error integration circuit 12 continues to represent the integrated charge error.

The multibit quantizer 14 provides a threshold for the error charge passed to the decoder block 16. The accuracy of the multibit quantizer 14 thresholds is less important than ensuring the quantity of charge fed back to the error summing node 24 of the error integration circuit 12 represents the same signal fed forward to the digital accumulator 18.

The decoder block 16 distributes the outputs from the multibit quantizer 14 to the accumulator 18 and the one or more charge feedback devices, which in this example include IDAC 20 and PWM 22, although other types and numbers of charge feedback devices may be utilized. The decoder block 16 determines how much charge needs to be fed back for the current cycle based on a combination of system radix (defined by the most significant digits of the digital accumulator 18) and the current cycle output of the multibit quantizer 14.

The decoder block 16 selects outputs to the IDAC 20 and PWM 22 such that the total charge fed back to the error integration circuit 12 in the next cycle represents the digital value fed forward to the accumulator 18. In one example, the decoder block 16 maps the outputs from the multibit quantizer 14 to the possible binary weighted enabled "Aout" with relative weights currents of 1, 2, 4 and a master current gain value of 0.5, 1, 2, although other relative weight currents and master current gain values may be utilized. In this example, the total charge fed-back is proportional to the PWM*Idac*Aout and the fed-forward Dout is proportional to the charge fed-back divided by 2radix, where the radix is the Exp3 input, by way of example only.

As the system radix changes, the smallest representable least significant bit changes and the effective signal gain of the LADC 10 also changes. It may be desirable, but not required, to adjust the gain of the error integrator 24 to reflect the change in signal gain. This can be accomplished by adjusting the error integration circuit 12 value or by modifying the effective thresholds of the multibit quantizer 14. The analog area is largely determined by the size of the error integrating error integration circuit 12 so scaling gain is not always practical.

The output from the multibit quantizer 14 is fed forward to the accumulator 18, although multiple accumulators may be utilized, which performs long term integration of the output of the multibit quantizer 14. During each sample cycle, the floating point number accumulator 18 adds the output from the multibit quantizer 14 to the previous output from the accumulator 18. If there is a carry or borrow between the mantissa and radix, the radix for the next sample cycle is different than the active cycle and the mantissa is adjusted such that the new mantissa is scaled (logical shift right or left) to the next sample cycle's radix. In an example with an array of LADCs, such as may be used in a digital focal plane array, the floating point number partial sum can be communicated to adjacent LADC(s) for digital spatial filtering, image stabilization or time delay and integration.

The accumulator 18 requires a large number of sample cycles to compute each output of the LADC 10. In one example, the sample cycle occurs $2^m$ times per output of the LADC 10, where m is the number of bits in the mantissa. For large input signals, it may take multiple output cycles of the LADC 10 for the radix to settle to the correct gain value. The settling time is dependent on the octaves of range covered by the multibit quantizer 14 and the number of bits in the mantissa.

In one example, the accumulator 18 integrates $2^i$ input samples for each output sample of the LADC 10 such that the integration time is closely coupled to the output sample rate of the LADC 10. The mantissa reset between outputs of the LADC 10 and the radix is decremented.

In one example, the effective integration time can be modified to be different than the output rate of the LADC 10 by modifying the accumulator 18 to be an infinite impulse response filter. The sample rate of the infinite impulse response filter should have an integer relationship to the multibit quantizer 14 samples per sample of the LADC 10. In at least one example, the infinite impulse response filter is first order filter with a feed forward coefficient 'a' of 1.0 (imposing system gain of 0.75) and a feedback coefficient 'b' of 0.5. This creates a frequency response with 3 dB cutoff of 0.3976 times the sample rate to the infinite impulse response filter and a group delay of 1.5 infinite impulse response samples (LADC samples), by way of example only.

Figure 3:
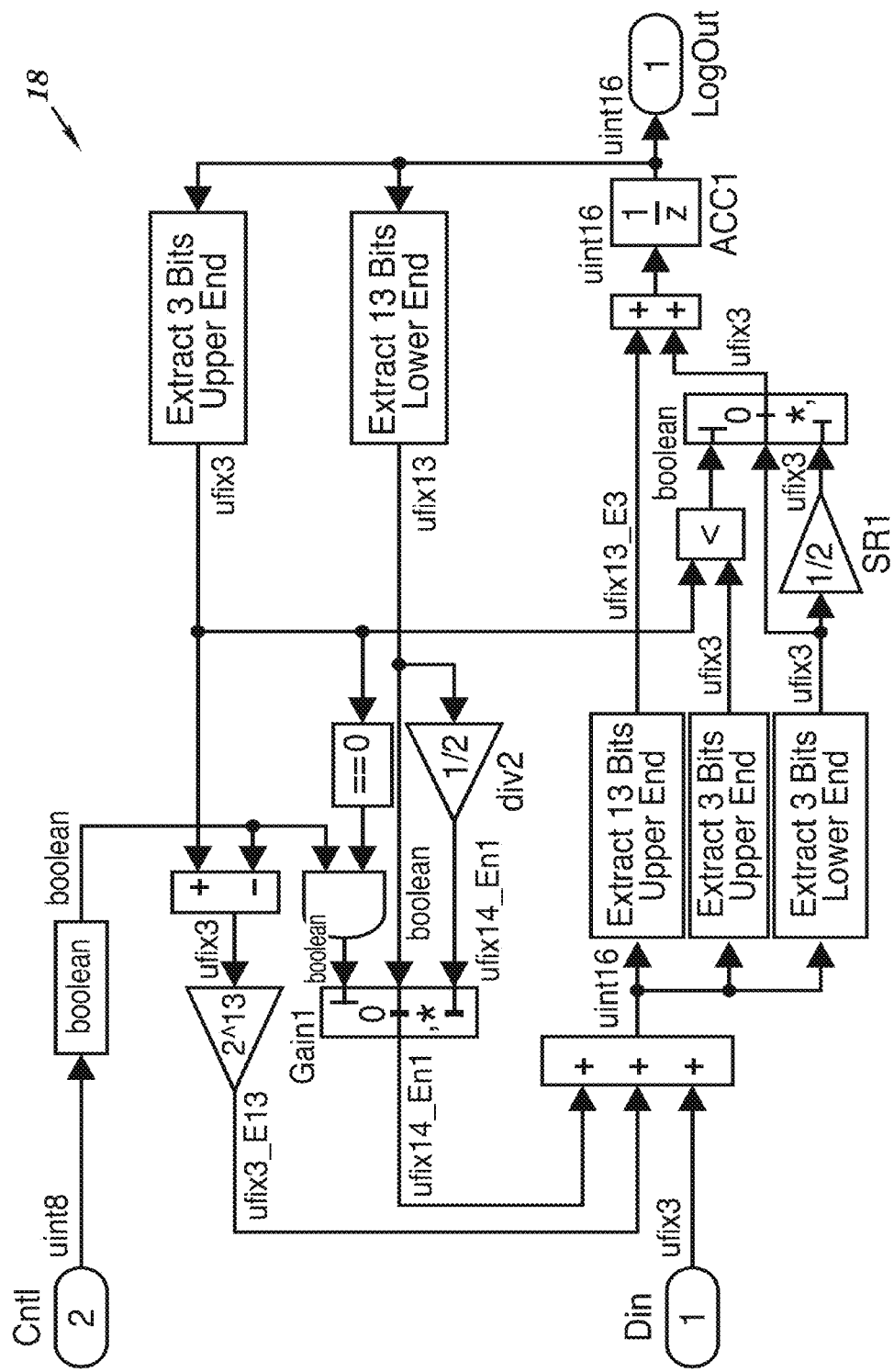
FIG. 3 is a schematic block diagram of an exemplary accumulator as illustrated in FIG. 1.

Referring more specifically to FIG. 3, an exemplary 13 bit mantissa, 3 bit radix floating point number accumulator 18 is illustrated. The input signal "Din" from the multibit quantizer 14 is added to the running sum ACC1. If, during a sample of the multibit quantizer 14, a carry is detected between the mantissa and the radix (old radix less than new radix), then the "Din" value is divided by 2 so that it is corrected for the new radix, by way of example.

In one example, the control signal "Cntl" signals the completion of a sample of the LADC 10, which then implements an infinite impulse response filter update by subtracting 0.5 times the current "LogOut" value from the next running sum output. The infinite impulse response "a" coefficient of 0.5 is implemented by subtracting 1 from the radix if the radix is not zero, and by dividing the mantissa by 2 (logical shift right) if the radix is already zero. In another example, the control signal signals a reset to zero of the accumulator 18. In yet another example, the control signal controls the transfer of the floating point number value to an adjacent LADC 10 to implement a time delay integration function.

In another example, "watchdog" counters detect a large number of consecutive maximum and minimum values from the multibit quantizer 14. On each quantizer sample, if the multibit quantizer 14 is not at its maximum value, the maximum watchdog counter is reset to zero; if the multibit quantizer 14 is not at its minimal value, the minimum watchdog counter is reset to zero. If the maximum watchdog count exceeds a threshold, typically $2^{m-3}$, and the radix is less than max_radix, then a radix up is performed (radix=radix+1, mantissa=mantissa/2). If the minimum watchdog count exceeds a threshold, typically $2^{m-3}$, and radix is greater than min_radix, then a radix down is performed (radix=radix−1, mantissa=mantissa*2). Since the precision of the threshold is not critical and the area for digital counters would be large, these watchdog counters are typically implemented using analog means such as a switched capacitor integrator or current source integrated onto a small capacitor and the voltage exceeding a threshold.

The decoder block 16 also distributes the outputs from the multibit quantizer 14 to one or more charge feedback devices, in this example the IDAC 20 and the PWM 22, although other types and numbers of charge feedback devices may be utilized, as discussed above. In this example, the PWM 22 and the IDAC 20 are used in combination. Since the radix of the system is dynamic (determined by the active sample cycle's most significant digits of the accumulator 18), the IDAC needs to cover a current range equivalent to the radix range of the accumulator 18.

In this example, the LADC 10 provides a logarithm base 2 output. A base 2 logarithmic (log 2) number can be represented using a floating point number. A floating point number can be expressed as an m-bit mantissa and a smaller r-bit radix such that the maximum signal to noise and distortion ratio is limited by the m-bit mantissa and the maximum dynamic range is limited by the m-bit mantissa times the $2^{\hat{}}$r-bit radix ($m*2^r$). The smallest possible floating point number word size would be rm or a 2 bit floating point word. One useful floating point number notation that may be employed for the present technology would be a 16 bit floating point number defined as rrrmmmmmmmmmmmmm, which would represent a 13 bit mantissa (with or without sign bit) and a 3 bit radix. The radix then represents number of binary places the binary point is shifted (to the right) so this 16 bit floating point number represents the equivalent of a 126 dB (13+8=21 bit) dynamic range with 78 dB (13 bit) signal to noise and distortion ratio.

For a floating point number with an radix of 3 bits, the required feedback signal range is $2^{\wedge}(2^3)$ or 256:1. The feedback signal can be controlled using switch cap techniques, a continuous time current sink/source with amplitude modulation, a current sink/source with time modulation, or any combination of techniques that control the quantity of charge fed back (the area under the current waveform) per quantizer sample time. In at least one example, a combination of current sink amplitude and time modulation is utilized.

Continuous time current sink/source can be implemented with traditional current mirror based digital to analog converter techniques. The range of currents needs to span at least a portion of the radix of the floating point accumulator 18. Since the radix represents a log space, the output range of the IDAC 20 should cover a similar range. In at least one example, the outputs of the IDAC 20 are binary weighted.

Time based feedback floating point digital to analog conversion modulation can be accomplished with a current sink that is pulse frequency, plus density, or pulse width modulated. In one embodiment the pulse width modulation pulse widths represent log 2 periods of time responsive to the latched exponent of the floating point output, the comparator output and the global skimming state.

The pulse width modulation widths can be controlled by a global digital ramp (or triangle) generator. One of the challenges with infrared focal planes is the non-image based background current proportional to the global scene temperature. This background current is often larger that the desired image signal and therefore increases (doubles) the signal to noise and distortion and dynamic range requirements of the system. By adding a current offset to the global digital ramp generator, the same floating point digital to analog converter can be used to sum in a DC current to "skim off" the majority of the background scene temperature related charge right at the input. For small signals (close to the scene temperature) this enables a lower radix and least significant bit to be utilized, which improves the system noise equivalent temperature difference. Typical skimming targets 80% removal of the scene temperature.

Example—Test Bench Containing Exemplary LADC 10

During development of the present technology, the analysis of the images and the approach to reading the data out of the array was done using Matlab and Simulink, produced by The Mathworks of Natick, Mass., to provide simulations of the read-out integrated circuit and sigma-delta modulator analog to digital converter. The design of the electronics hardware was performed using the Cadence schematic capture, Spectre simulator, and Virtuoso layout tools, both of which are available from Cadence of San Jose, Calif.

Figure 6:
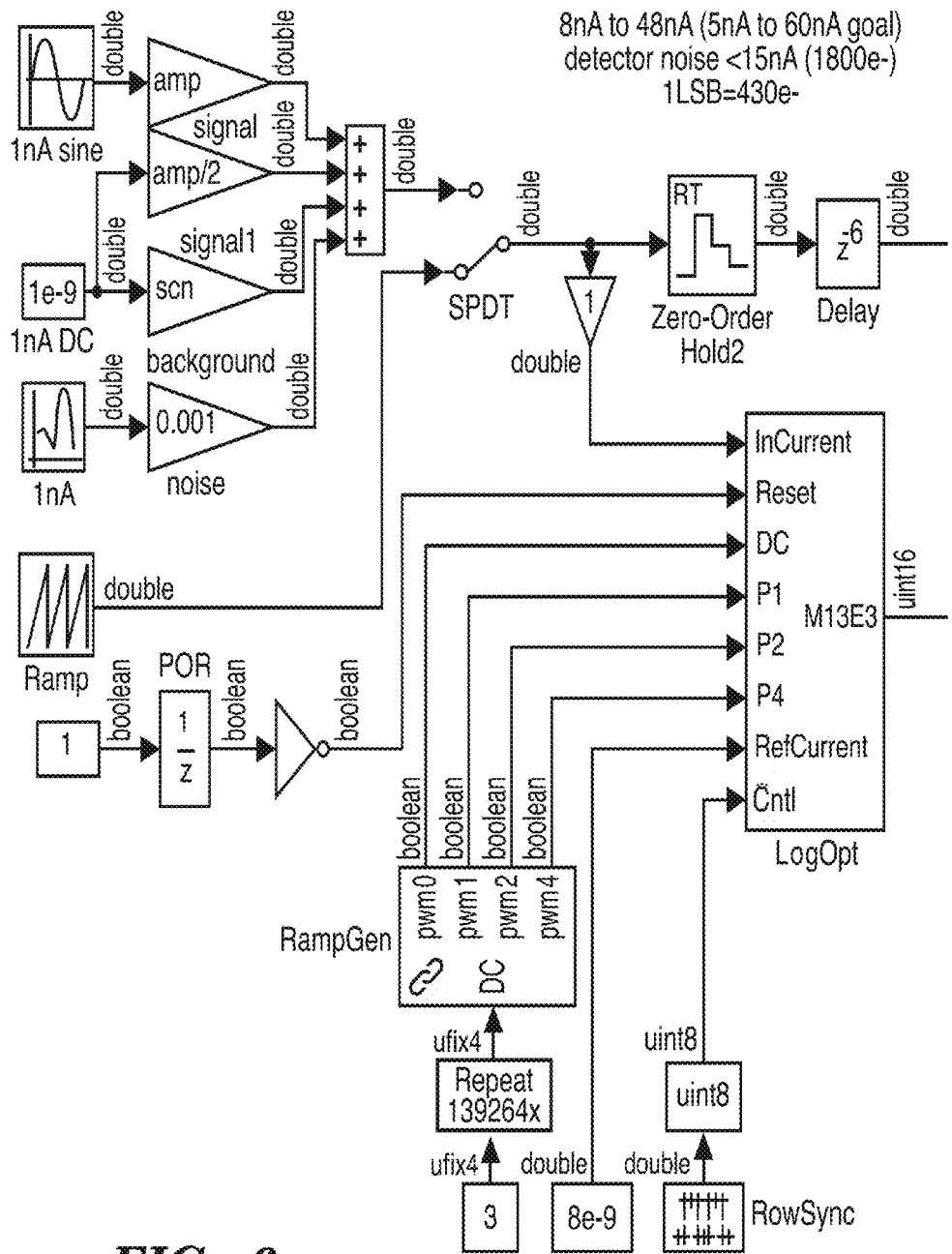
FIG. 6 is a schematic block diagram of an exemplary test bench used to evaluate the performance of a logarithmic analog digital converter of the present technology.
Figure 6:
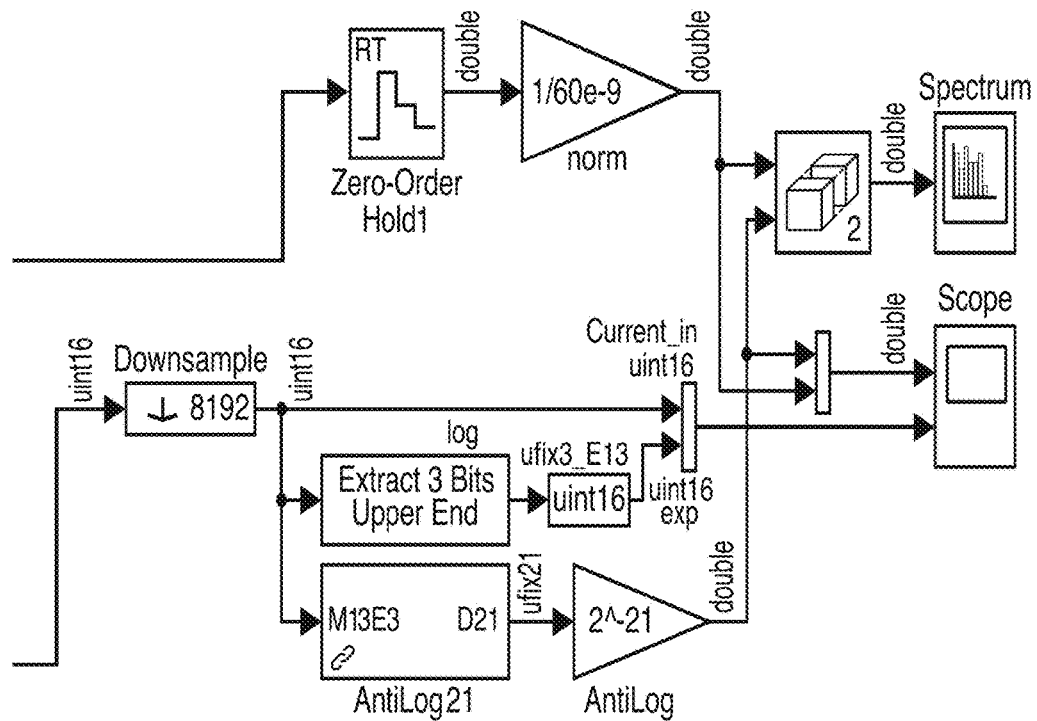
Figure 6:
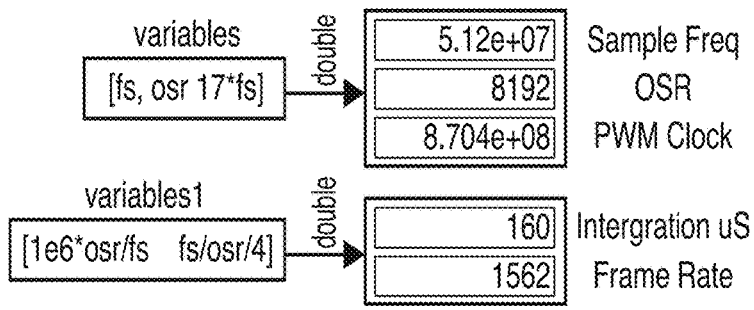

Referring to FIG. 6, a test bench for a logarithmic analog to digital converter (LADC) of the present technology is illustrated. The stimulus is assumed to be a current responsive to the image intensity. The single-pole double throw (SPDT) switch selects between a linear ramp generator to evaluate the differential non-linearity (DNL) and the integral non-linearity (INL) as the LADC transitions between octaves and a noisy sign wave source to evaluate the effective number of bits and noise floor for a large input signal. Other inputs to the LADC 10 include a power on reset, a global digital pulse width modulation (PWM) ramp, a global reference current, and a row sync timing signal.

Instruments for evaluating performance including a frequency domain spectrum analyzer and a time domain scope were utilized. In at least one example, the LADC produces a log 2 signal output using a 13^3 encoding format, which can represent a 21 bit dynamic range with 13 bit signal to noise ratio.

Figure 7:
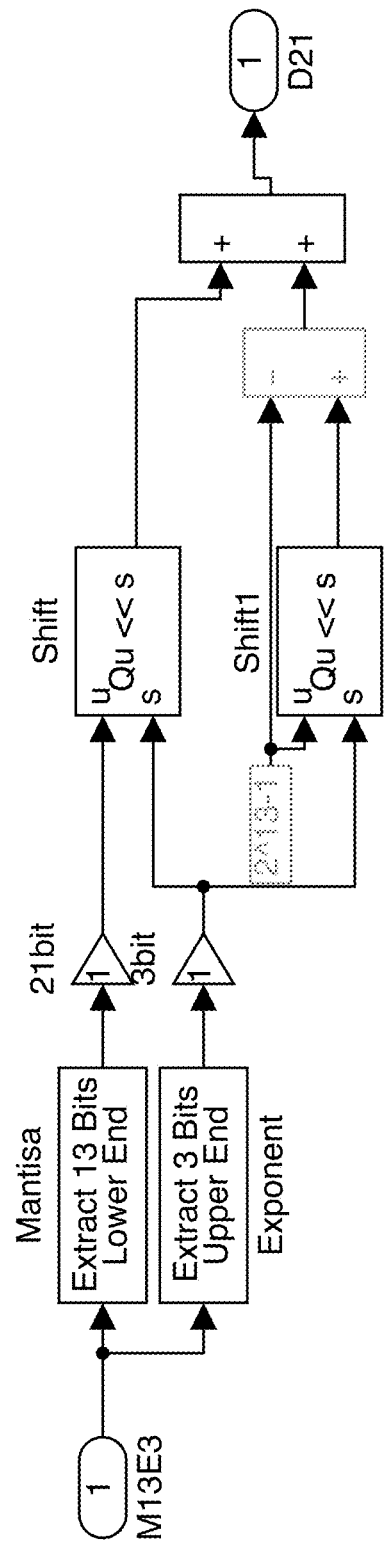
FIG. 7 is a schematic block diagram of an exemplary anti-log circuit used by the test bench illustrated in FIG. 6 to reconstruct the linear output from the floating point output.

The test bench element AntiLog 21, as further illustrated in FIG. 7, converts the 13^3 space output back to a 21 bit linear output for evaluation. The floating point number piecewise linear log 2 output of the LADC can be converted into a linear number system using simple shift operations with "1." The floating point number is decomposed into the 3 bit radix (exponent of 2) and the 13 bit mantissa. The mantissa is shifted left to realize a multiplication by 2radix and 'ones' are shifted left to backfill the vacant least significant bits. This Anti-Log 2 is part of the exemplary test-bench, and not required for LADC operation.

Figure 8:
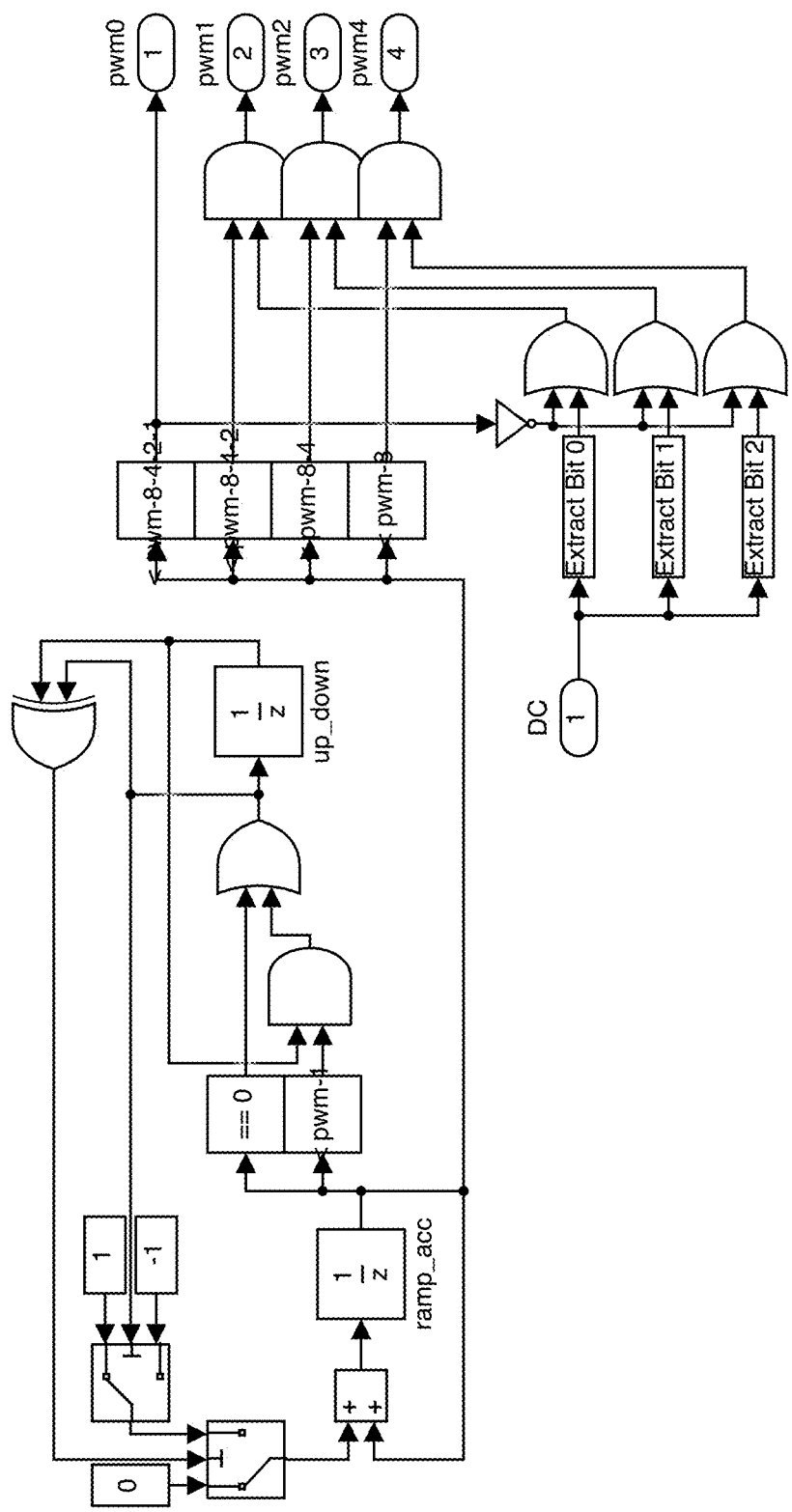
FIG. 8 is a schematic block diagram of an exemplary global PWM ramp generator of the test bench illustrated in FIG. 6 which creates a plurality of outputs of a fixed frequency but different pulse widths.

Referring to FIG. 8, the pulse width modulation ramp generator of the exemplary test bench is illustrated. The pulse width modulation ramp generator has multiple outputs, all with frequency comparable to the quantizer sample rate, but with varied duty cycle. When multiple LADCs are instantiated, this can be a global resource. In at least one example, the pulse width modulations are "center weighted", which effectively halves the output pulse width modulation frequency and reduces the number of current output digital to analog converter edges from two per quantizer sample to one per quantizer sample.

In at least one example, the pulse width modulation timebase is 33 times higher than the quantizer sample rate, allowing the "zero" count of the pulse width modulation to be used for scene "skimming" and the 1, 2, 4, 8, 16 clock edges to be used for controlling the pulse duration based on the active radix and/or quantizer value. A center weighted ramp counts up (0 to 16) during a first quantizer cycle and down (16 to 0) on the second quantizer cycle then up again on the third. Both 0 and 16 appear twice per occurrence, although 16 is assumed to always be high and does not need to be sent as a pulse width modulation ramp output. The pulse width modulator control in the LADC selects which of the pulse width modulation outputs are active. During the 0 count, the DC or scene skimming magnitude is presented to the pulse width modulation control in the current output digital to analog converter. The skimming pulse width is always one pulse width modulation clock of the 33 pulse width modulation clocks per quantizer sample. In another example, the pulse width modulation ramp counts only in one direction and does not include a DC skimming budget.

Figure 10:
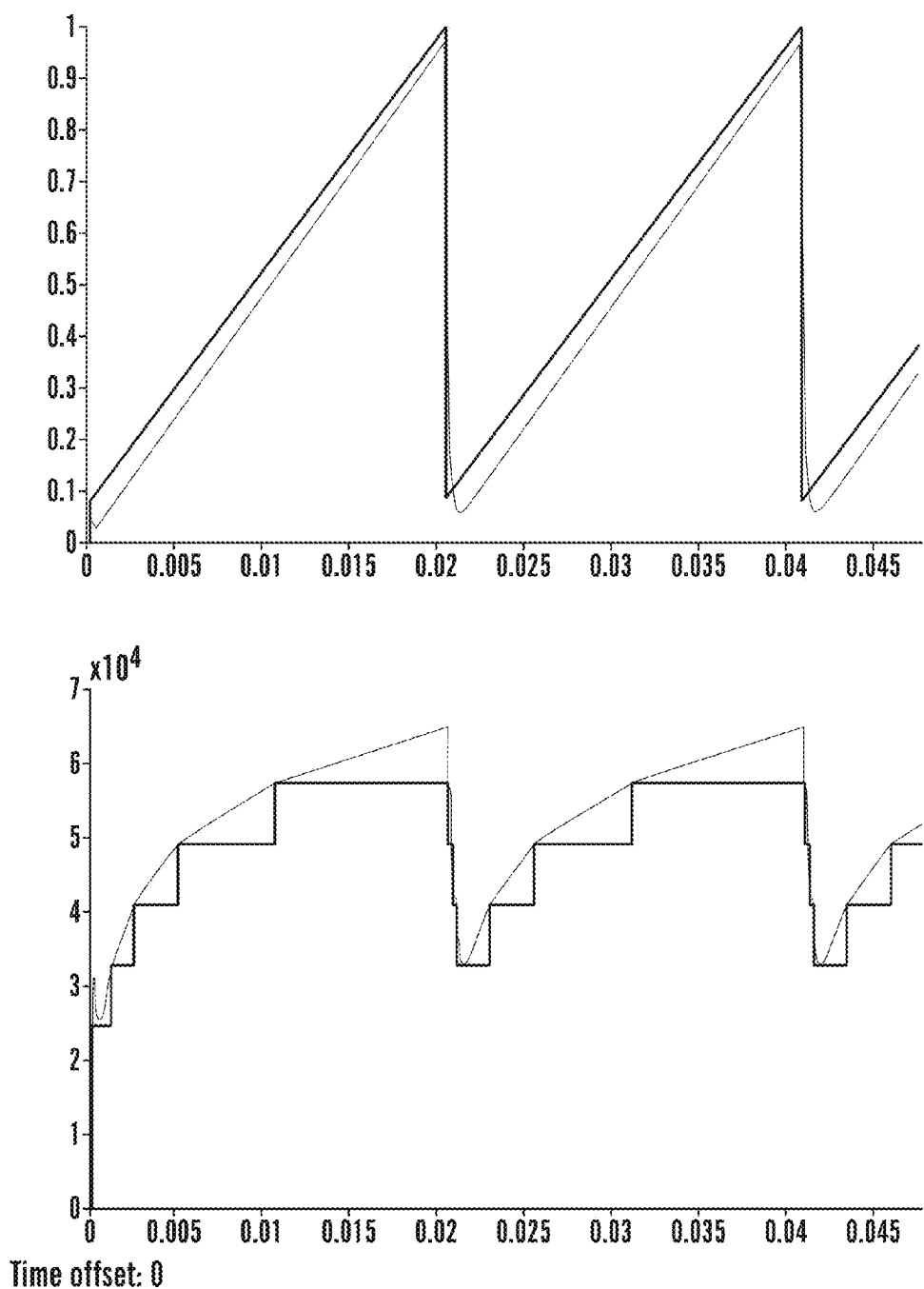
FIG. 10 is a time based waveform of an example of a piece wise linear log 2 output and its linear representation in response to a 21 bit dynamic range linear ramp input for an exemplary analog to digital converter of the present technology.

FIG. 10 illustrates the simulated LADC 16 bit floating point number output in response to a linear ramp analog input spanning a 21 bit dynamic range. The top graph demonstrates the analog input and the LADC output after applying the antilog 2 logic. The LADC output has skimmed off much of the scene amplitude (10% of full scale).

The lower plot shows the same LADC output before the antilog 2 function and the just the scaled 3 bit radix demonstrating the piecewise linear nature of the LADC for each of the radixes exercised by the input signal. Six of the potential eight radixes steps are exhibited in this simulation result.

The application of a log 2 ADC to imaging required processing the image pixels such that the value of a string of pixels changed in small steps. The inherent spatial bandwidth of a pixel is a low pass function (integrator). The hardware was designed, simulated, and laid out to quantify the power and area requirements and to understand how those would compare to current read out integrated circuits.

Flexibility of the read out integrated circuit described herein is a key requirement to support emerging infrared digital focal plane devices, in accordance with at least some examples of the technology. The read out integrated circuit described herein is capable of supporting a wide range of infrared detectors. The read out integrated circuit disclosed herein can further be used with multiple existing detectors. For example, many companies have designed existing detectors to work with the commercial off the shelf FLIR 9705 analog read out integrated circuit. The examples of the read out integrated circuit disclosed herein can be adapted to work with the FLIR 9705 compatible mechanical footprint.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Accordingly, the invention is limited only by the following claims and equivalents thereto.

What is claimed is:

1. An analog to digital converter comprising:
   an error integration circuit configured to receive an input charge from a detector and to integrate a difference between the input charge and one or more feedback charge pulses to create an error voltage;
   an input time base circuit coupled to the error integration circuit and configured to control timing of a charge to error voltage conversion to create the error voltage;
   a quantizer in operable communication with the error integration circuit and responsive to the error voltage;
   an accumulator in operable communication with the quantizer, the accumulator having a mantissa component and a radix component;
   a charge feedback device in operable communication with the quantizer and the radix component of the accumulator, the charge feedback device configured to generate the one or more feedback charge pulses proportional to the radix component of the accumulator and an output of the quantizer.

2. The converter of claim 1, wherein the input time base circuit provides a plurality of pulse-width modulated signals.

3. The converter of claim 2, wherein the pulse-width modulated signals have a range of widths that at least partially cover a radix range of the accumulator.

4. The converter of claim 1, wherein the converter is configured to provide a logarithm base 2 output.

5. The converter of claim 1, wherein the converter is configured to provide a piece-wise-linear representation of a log function.

6. The converter of claim 1, wherein the error integration circuit is configured to receive the input charge as a direct injection into an error node of the error integration circuit.

7. The converter of claim 1, wherein the quantizer comprises a multi-level quantizer.

8. The converter of claim 7, wherein the quantizer comprises a plurality of comparators.

9. The converter of claim 1, wherein the accumulator comprises a 13 bit mantissa component and a 3 bit radix component.

10. The converter of claim 1, wherein the charge feedback device comprises a multi-level current output digital to analog converter.

11. The converter of claim 1, wherein the charge feedback device comprises a pulse width modulator.

12. A digital focal plane read out integrated circuit comprising:
    a detector; and
    an analog to digital converter coupled to the detector, the analog to digital converter comprising:
        an error integration circuit configured to receive an input charge from the detector and to integrate a difference between the input charge and one or more feedback charge pulses to create an error voltage;
        a quantizer in operable communication with the error integration circuit and responsive to the created error voltage;
        an accumulator in operable communication with the quantizer, the accumulator having a mantissa component and a radix component;
        a charge feedback device in operable communication with the quantizer and the radix component of the accumulator, the charge feedback device configured to generate the one or more feedback charge pulses proportional to the radix component of the accumulator and an output of the quantizer.

13. The digital focal plane read out integrated circuit of claim 12, wherein the converter further comprises:
    an input time base coupled to the error integration circuit and configured to control timing of a charge to error voltage conversion to create the error voltage.

14. The digital focal plane read out integrated circuit of claim 13, wherein the input time base comprises a plurality of pulse-width modulated signals.

15. The digital focal plane read out integrated circuit of claim 14, wherein the pulse-width modulated signals have a range of widths that at least partially cover a radix range of the accumulator.

16. The digital focal plane read out integrated circuit of claim 12, wherein the converter is configured to provide a logarithm base 2 output.

17. The digital focal plane read out integrated circuit of claim 12, wherein the converter is configured to provide a piece-wise-linear representation of a log function.

18. The digital focal plane read out integrated circuit of claim 12, wherein error integration circuit is configured to receive the input charge as a direct injection into an error node of the error integration circuit.

19. The digital focal plane read out integrated circuit of claim 12, wherein the quantizer comprises a multi-level quantizer.

20. The digital focal plane read out integrated circuit of claim 19, wherein the quantizer comprises a plurality of comparators.

21. The digital focal plane read out integrated circuit of claim 12, wherein the accumulator comprises a 13 bit mantissa component and a 3 bit radix component.

22. The digital focal plane read out integrated circuit of claim 12, wherein the charge feedback device comprises a multi-level current output digital to analog converter.

23. The digital focal plane read out integrated circuit of claim 1, wherein the charge feedback device comprises a pulse width modulator.

24. A digital focal plane read out integrated circuit comprising:
- a plurality of detectors formed in an array; and
- an analog to digital converter coupled to each of the plurality of detectors in the array, each of the converters comprising:
    - an error integration circuit configured to receive an input charge from the detector and to integrate a difference between the input charge and one or more feedback charge pulses to create an error voltage;
    - a quantizer in operable communication with the error integration circuit and responsive to the created error voltage;
    - an accumulator in operable communication with the quantizer, the accumulator having a mantissa and radix component;
    - a charge feedback device in operable communication with the quantizer and the radix component of the accumulator, the charge feedback device configured to generate the one or more feedback charge pulses proportional to the radix component of the accumulator and an output of the quantizer.

* * * * *